United States Patent [19]

Tanabe et al.

[11] Patent Number: 5,567,522
[45] Date of Patent: Oct. 22, 1996

[54] DIAMOND CUTTING TOOL AND METHOD OF MANUFACTURING THE SAME

[75] Inventors: Keiichiro Tanabe; Akihiko Ikegaya; Toshiya Takahashi; Naoji Fujimori, all of Hyogo, Japan

[73] Assignee: Sumitomo Electric Industries, Ltd., Osaka, Japan

[21] Appl. No.: 318,188

[22] Filed: Oct. 5, 1994

Related U.S. Application Data

[63] Continuation-in-part of Ser. No. 28,324, Mar. 9, 1993, abandoned.

[30] Foreign Application Priority Data

Mar. 10, 1992 [JP] Japan ..................................... 4-51823

[51] Int. Cl.$^6$ ....................................................... B24D 3/00
[52] U.S. Cl. .............................. 428/408; 51/307; 51/309; 428/141; 428/148; 428/457
[58] Field of Search .................................... 428/141, 408, 428/457, 148; 51/307, 309

[56] References Cited

U.S. PATENT DOCUMENTS 5,178,645  1/1993  Nakamura et al. ..................... 51/307

Primary Examiner—Archene Turner
Attorney, Agent, or Firm—W. G. Fasse; W. F. Fasse

[57] ABSTRACT

A diamond cutting tool has a rake face (5) of a cutting edge member (2) consisting essentially of a (111) plane of diamond. The cutting edge member (2) of diamond is vapor-deposited by CVD or the like on an independently prepared base material. In this vapor deposition, the diamond is deposited while controlling and periodically varying the carbon to hydrogen ratio of the supplied raw material gas, in such a manner that a (111) crystal plane is oriented with a prescribed fluctuation or non-uniformity, but is substantially parallel to the base material surface. The as-formed diamond material is separated from the base material and cut into a desired shape, and then bonded as a cutting edge member (2) to a tool base (1) through a metallization layer (4) and a brazing layer (3), in such an orientation that the (111) plane defines the rake face (5). The tool having such a rake face (5) consisting essentially of the (111) plane, with a prescribed fluctuation of its orientation, is excellent in wear resistance and is resistant to cleavage damage.

9 Claims, 5 Drawing Sheets

DIAMOND CUTTING TOOL AND METHOD OF MANUFACTURING THE SAME

CROSS-REFERENCE TO RELATED APPLICATIONS

The present application is a Continuation-In-Part application of U.S. Ser. No. 08/028,324, filed on Mar. 9, 1993, and entitled: DIAMOND CUTTING TOOL AND METHOD OF MANUFACTURING THE SAME now abandoned. The present application is related to our copending application U.S. Ser. No.: 08/084,298, filed on Jun. 29, 1993, and entitled: CUTTING TOOL EMPLOYING VAPOR-DEPOSITED POLYCRYSTALLINE DIAMOND FOR CUTTING EDGE AND METHOD OF MANUFACTURING THE SAME, the substance of which is incorporated herein by reference.

BACKGROUND OF THE INVENTION

1. Field of the Invention

The present invention relates to a diamond cutting tool, and more particularly, it relates to a cutting tool having a cutting edge of diamond formed by vapor deposition that is excellent in wear resistance, heat resistance and chipping resistance. The invention further relates to a method of manufacturing such a cutting tool.

2. Background Information

Diamond, which is excellent in hardness and thermal conductivity, is particularly useful as a material for forming a tool for cutting otherwise uncuttable materials. Such diamond materials applicable to tools are classified into single-crystalline and polycrystalline diamond materials. However, single-crystalline diamond is extremely high-priced, hard to work and easy to cleave, although the same is an excellent material in consideration of its physical characteristics.

On the other hand, polycrystalline diamond materials which are applicable to tools can be roughly classified into two types. The first type is sintered diamond, which is obtained by sintering fine diamond powder and an iron family metal such as Co under diamond-stable, very high pressure and temperature conditions. Such a sintering technique is described in Japanese Patent Publication No. 52-12126 (1977), for example. It is known that, among commercially available sintered diamond materials, especially those materials having a grain size not more than several tens of microns have an excellent wear resistance with no cleavage such as that caused in the aforementioned single-crystalline diamond. However, sintered diamond contains several to several 10% of a binder, whereby a cutting edge of such sintered diamond may be chipped due to removal or falling-out of diamond particles forming the sintered body. Since such particle fall-out is remarkably increased as the wedge angle of the cutting edge is reduced, it is difficult to maintain a sharp cutting edge of sintered diamond for a long time. Further, the sintered diamond is inferior in heat resistance to the single-crystalline diamond and easily worn in cutting, due to the binder contained therein.

As compared to sintered diamond, vapor-deposited diamond, which is the second type of polycrystalline diamond applicable to a cutting tool, is superior in heat resistance and wear resistance and is hardly affected by chipping since the same is dense and consists essentially of only diamond. Such vapor-deposited diamond is generally prepared by chemical vapor deposition (CVD) by decomposing and exciting a raw material, which is mainly composed of hydrocarbons such as methane and hydrogen, at a low pressure.

As to a cutting tool employing such vapor-deposited diamond, a diamond-coated tool comprising a tool substrate directly coated with diamond has been developed, for example. In such a diamond-coated tool, adhesion between the tool substrate and a diamond thin film coating the same is important, because the diamond thin film may be separated during cutting work in a tool of cemented carbide coated with such a diamond thin film, for example.

There has also been developed a diamond cutting tool comprising a tool substrate and brazed thereto a member containing vapor-deposited diamond. For example, each of Japanese Patent Laying-Open Nos. 1-153228 (1989) and 1-210201 (1989) discloses a technique of directly brazing a base material, which is coated with vapor-deposited diamond, to a tool substrate of cemented carbide to prepare a cutting tool. In order to apply such a tool to practical use, however, it is necessary to polish the base material or the diamond film on a rake face side. In such vapor-deposited diamond, the diamond surface is so coarse immediately after vapor deposition that it is necessary to polish this surface to use the same as a rake face of a cutting edge. In order to facilitate such finishing, diamond which is vapor-deposited on a base material is generally so formed that a (100) and/or a (110) diamond crystal plane is oriented in parallel with the base material surface. In general, therefore, a rake face of an insert is formed by the (100) or (110) plane. However, such a (100) or (110) plane cannot be regarded as optimum in consideration of wear resistance of the cutting tool, although the same is preferable in view of the aforementioned polishing. Improved wear resistance of the cutting tool can be achieved if the (111) plane is oriented in parallel with the rake face of the tool. However, if the (111) crystal planes of all the crystal grains of a polycrystalline diamond tool material are aligned completely uniformly, then the diamond material, and especially the rake face, will have properties similar to that of a (111) single crystal. Such a rake face has the disadvantage that cleavage and resultant damage to the tool is likely. Therefore, the (111) crystal planes should not be completely uniformly oriented, but rather some fluctuation of the (111) plane is very important to prevent damage caused by cleavage. It is known in the prior art, for example European Patent Application No. 0,319,926 and European Patent Application No. 0,449,571, to synthesize diamond by vapor phase deposition using a material gas having a constant carbon concentration or a continuous or step-wide monotonously varying carbon concentration. However, by following such a method, it is difficult to deposit polycrystalline diamond with oriented (111) crystal planes, with a prescribed fluctuation of the orientation within an appropriate range to avoid the cleavage problems described above.

SUMMARY OF THE INVENTION

An object of the present invention is to provide a diamond cutting tool that is superior in wear resistance to the prior art and that nonetheless avoids the cleavage weakness associated with the uniform alignment of (111) crystal planes.

The diamond cutting tool according to the present invention is characterized in that it has a cutting edge which consists essentially of a vapor-deposited polycrystalline diamond material, wherein a principal diamond crystal plane forming a rake face of the cutting edge is the (111) plane. The orientation of the (111) planes of the crystal grains is not absolutely uniform, but has a fluctuation such that the (111) plane has an FWHM (full width at half maximum intensity) value in the range from about 2° to about 20° in a rocking curve obtained by introducing X-rays through the rake face. Thus, the FWHM value of the (111) plane is an index showing the orientation property of the (111) plane. In addition, the (220) plane preferably has an FWHM value of at least about 20° in such a rocking curve.

In such a cutting edge, the (111) plane is preferably oriented as a principal plane, with the prescribed fluctuation but generally as parallel as possible to the rake face, up to a depth of at least 20 μm from the rake face. In the rake face and its proximity (e.g., up to a depth of about 20 μm from the rake face), it is preferable to suppress mixing of crystal planes other than the (111) plane to the minimum. Assuming that the (111) plane is 100 in intensity in an X-ray analysis, then the (220), (311), (400) and (331) planes are each preferably not more than about 80, and more preferably not more than about 10 in intensity respectively.

In the cutting tool according to the present invention, further, the rake face preferably has surface roughness $R_{max}$ of not more than about 0.5 μm.

The inventive diamond cutting tool can be manufactured by either one of the following two methods. A first manufacturing method according to the present invention includes a step of preparing a base material having a mirror-finished surface for depositing diamond thereon, a step of depositing diamond on the surface by vapor deposition so that its (111) plane is oriented with a prescribed fluctuation but substantially in parallel with the surface, a step of separating or removing the base material on which the diamond is deposited to obtain a diamond material serving as a cutting edge member, and a step of brazing the diamond material to a tool substrate so that a surface of the diamond material having been in contact with the base material defines a rake face.

A second manufacturing method according to the present invention includes a step of preparing a base material having a surface for depositing diamond thereon, a step of depositing a first diamond layer on the surface by vapor deposition so that its (111) plane is oriented with a prescribed fluctuation but substantially in parallel with the surface, a step of then depositing a second diamond layer on the first diamond layer so that a crystal plane being lower in hardness than the (111) plane is oriented substantially uniformly, thereby obtaining a diamond material for serving as a cutting edge member, a step of brazing the diamond material to a tool substrate so that a rake face of a cutting edge is defined by the second diamond layer side, and a step of removing the second diamond layer by mirror polishing, thereby exposing the (111) plane.

The foregoing and other objects, features, aspects and advantages of the present invention will become more apparent from the following detailed description of the present invention when taken in conjunction with the accompanying drawings.

DETAILED DESCRIPTION OF PREFERRED EXAMPLE EMBODIMENTS OF THE INVENTION

Figure 1:
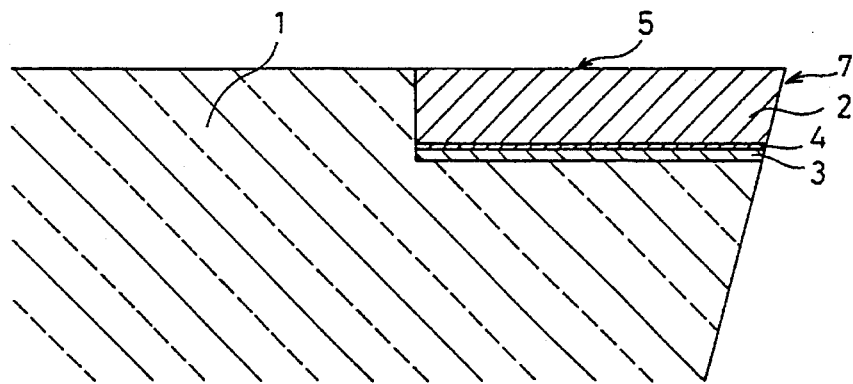
FIG. 1 is a sectional view schematically illustrating a diamond cutting tool prepared in Example 1.

According to the present invention, various vapor deposition methods may be used for forming the diamond. For example, a CVD method of decomposing/exciting a raw material gas by thermionic emission or plasma discharge, another CVD method employing a combustion flame and the like are effective. The raw material gas can be mainly composed of a mixture of hydrocarbons such as methane, ethane or propane, alcohol such as methanol or ethanol or an organic carbon compound such as ester and hydrogen. The raw material gas may additionally contain an inert gas or gases such as argon, oxygen, carbon monoxide, water and the like in a range not inhibiting the deposition of diamond and the desirable characteristics thereof.

The (111) plane can generally be formed and oriented according to the invention by controlling and varying the carbon concentration with respect to hydrogen, for example, in the aforementioned CVD. Such a method of forming the diamond material according to the invention is described more particularly below. A base material for vapor deposition is preferably made of Si or Mo, for example. Such a base material can be separated or removed from the diamond by mechanical machining or dissolution or separation by chemical processing.

In the first one of the aforementioned manufacturing methods, the surface of the base material to be provided with diamond is preferably mirror-finished to be not more than about 1 μm, more preferably not more than about 0.2 μm in surface roughness ($R_{max}$). It is possible to deposit the diamond in a thickness of about 20 to 3000 μm, for example, by CVD or the like on such a mirror-finished base material surface. After this base material is separated or removed as described above, the remaining diamond may be directly subjected to a next step, or worked into proper dimensions by cutting, for example. The diamond material obtained by separating or removing the base material is then brazed to a tool substrate, in such an orientation that a diamond surface which has been in contact with the base material, i.e., a crystal growth start surface, is oriented to define a rake face of a cutting edge. In general, therefore, a surface opposite to this surface, i.e., a crystal growth end surface, is employed as the brazing surface. This surface to be brazed is preferably provided with a metallization layer consisting of a metal included in groups IVa, IVb, Va, Vb, VIa, VIb, VIIa or VIIb of the periodic table or a compound thereof, in advance of the brazing. The brazing can be effectively performed through this metallization layer.

According to this method, diamond is first deposited on a mirror-finished base material surface by vapor deposition. Thus, in the diamond material obtained by separating or removing the base material after deposition of the diamond, the surface which has been in contact with the base material is already mirror-finished. This surface does not need to be polished, or is sufficiently subjected to simple polishing. Further, the vapor deposition is so performed, as described in detail below, that the (111) plane is oriented with a prescribed fluctuation but generally in parallel with the base material surface, whereby the surface of the diamond material which has been in contact with the base material is substantially occupied by the (111) plane. When the diamond material is so brazed to a tool substrate that the surface which has been in contact with the base material defines a rake face, it is possible to easily obtain a tool which is superior in wear resistance to the prior art.

If a surface other than the surface that has been in contact with a base material is adapted to define a rake face in such a diamond material prepared by vapor deposition, the following problem results. A surface such as a growth end surface in vapor deposition, for example, can also be substantially occupied by the (111) plane. However, the growth end surface is so coarse that the same must be polished for defining a rake face, and it is extremely difficult to polish this surface due to the high hardness of the (111) plane. Further, the growth end surface has a relatively large diamond crystal grain size. This surface is more liable to chip than is the growth start surface. When the surface which has been in contact with the base material is employed as a rake face, on the other hand, no chipping is caused and excellent wear resistance is attained since this surface is flat and has a fine grain size structure. This surface does not need to be polished, or it is sufficient to subject it to simple machining.

In the second one of the aforementioned manufacturing methods, a second diamond layer having low hardness is deposited on the (111) plane of a first diamond layer which is formed to a thickness of about 20 to 3000 μm. A crystal plane which is lower in hardness than the (111) plane can generally be formed by increasing the carbon concentration with respect to gaseous hydrogen, for example, in the aforementioned CVD. A (220) plane, for example, is preferably selected as such a crystal plane having low hardness. The second, lower hardness diamond layer preferably has a crystal plane lower in hardness than the (111) plane oriented uniformly, and preferably has a thickness of about 50 μm, more preferably about 10 μm.

In this method, a diamond material for serving as a cutting edge member may be prepared from diamond which is independent of a base material separated or removed therefrom, or from diamond which remains deposited on such a base material. The as-obtained diamond material may be directly subjected to a next step, or it may first be worked into proper dimensions by cutting or the like, for example. In the next step, the diamond material serving as a cutting edge member is brazed to a tool substrate so that the diamond layer side defines a rake face. In general, therefore, in this second method, the diamond surface which has been in contact with the base material during the vapor deposition, i.e., the crystal growth start surface, is employed as the brazing surface. The surface to be brazed may be provided with a metallization layer, which is similar to that described above, in advance of the brazing. The brazing can be effectively performed through this metallization layer.

Then, the diamond layer having low hardness is removed by polishing, thereby exposing the (111) plane of the previously formed, first diamond layer. In this step, a rake face obtained by exposing the (111) plane by mirror polishing preferably has a surface roughness $R_{max}$ of not more than about 0.2 μm, for example. In the rake face obtained after mirror finishing, and in the proximity of the rake face (e.g., up to a depth of about 20 μm from the rake face), further, it is preferable to suppress the mixing of crystal planes other than the (111) plane to the minimum. Assuming that the (111) plane is 100 in intensity in an X-ray analysis, for example, the (220), (311), (400) and (331) planes are each preferably not more than about 80, more preferably not more than about 10 in intensity respectively.

In this second manufacturing method, the second diamond layer having a crystal plane of low hardness oriented therein is deposited on the first diamond layer provided with the (111) plane of high hardness oriented therein. Due to the low hardness, the second diamond layer can be easily mirror-polished. When the diamond material is brazed onto the tool substrate in such an orientation that a rake face of a cutting edge is defined by the second diamond layer side and thereafter this diamond layer is removed by mirror polishing to expose the (111) plane, it is possible to provide a rake face having high flatness, which is substantially formed of the (111) plane.

According to each of the aforementioned two processes, it is possible to provide a diamond cutting tool having a rake face which is flat and consists essentially of the (111) plane. The (111) plane has the highest hardness among the diamond crystal planes. Therefore, a tool having such a hard rake face is superior in wear resistance to the prior art.

Figure 3:
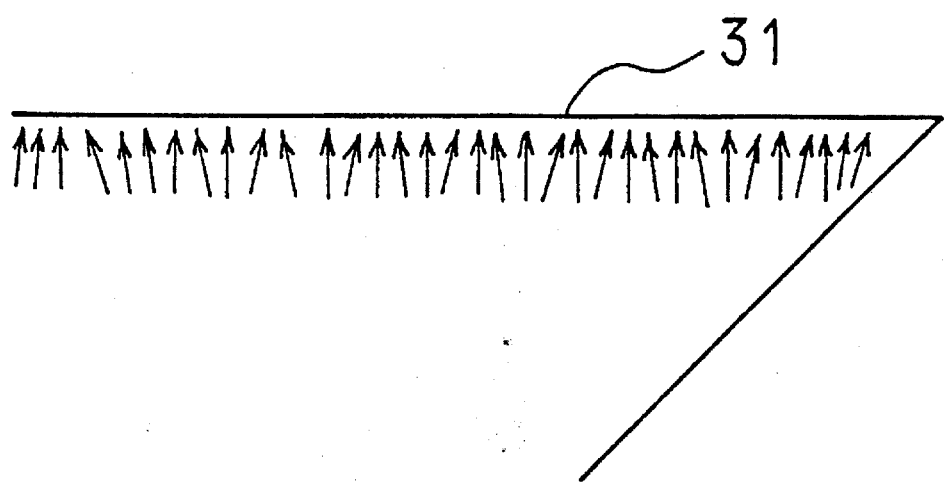
FIG. 3 is a schematic cross-sectional view showing the orientation of <111> crystal axes of diamond crystal grains in a diamond tool rake face.

However, as mentioned above, the (111) planes of all the crystal grains should not be perfectly uniformly oriented, because then cleavage damage becomes likely, similarly to single crystal (111) diamond materials. Therefore, in the diamond cutting tool of the present invention, the principal diamond crystal plane constituting the rake face of the cutting edge is a (111) plane, while the rake face is formed of polycrystalline diamond. Thus, the rake face is constituted of a large number of crystal grains in which the <111> crystal axis of the respective grains is oriented substantially parallel among the crystal grains, and substantially perpendicular to the rake face. Such a state of the rake face can be schematically shown, for example, as in FIG. 3. In this figure, the arrows denote the directions of the <111> axes, and the (111) planes are perpendicular to these directions shown by the arrows. At the rake face 31, the (111) planes of all the crystals are not oriented in a uniform direction but vary to some extent. This variation, hereinafter referred to as fluctuation of the (111) plane, is important. If there is no fluctuation of the (111) plane at the rake face, it can be said that the rake face has properties close to that of a (111) single crystal. However, a rake face consisting of (111) single crystal is not preferable, because cleavage is likely. The fluctuation of the (111) plane is very important to prevent damage caused by cleavage.

The fluctuation of the (111) plane of the rake face can be defined by the FWHM value (full width at half maximum intensity) of the rocking curve of the (111) plane obtained by directing X-ray radiation at the rake face. If the FWHM value is close to 0, the properties of a single crystal become dominant at the rake face, making cleavage more likely at the cutting edge. Meanwhile, if the FWHM value becomes too large, it means that the (111) plane is not sufficiently uniformly oriented with respect to the rake face, and therefore a cutting edge having superior wear resistance cannot be obtained. Fluctuation of the (111) plane in an appropriate range, that is, the FWHM value in an appropriate range, provides superior wear resistance and cleavage resistance for the rake face. In the tool according to the present invention, the FWHM value of the rocking curve of the (111) plane obtained by directing X-ray radiation at the rake face of the cutting edge member is from about 2 to about 20 degrees. When the FWHM value is in the range of 0° to 2°, the crystal grains constituting the rake face become larger, and the properties of a single crystal become dominant, so that cleavage at the cutting edge becomes more likely. If the FWHM value exceeds 20°, sufficiently uniform orientation of the (111) plane of the crystal grains at the rake face cannot be obtained, making it difficult to provide superior wear resistance.

The polycrystalline diamond having the FWHM value in the range of 2° to 20° for the (111) plane can be formed by periodically changing or varying the concentration of carbon with respect to hydrogen over time during formation of the diamond. Typically, a raw material gas having a low carbon concentration and a raw material gas having a high carbon concentration are alternatingly supplied in a cycle that repeats periodically, during vapor phase synthesizing of the diamond. More specifically, a material gas (A) having a ratio (C/H) of the number of atoms of carbon with respect to the number of atoms of hydrogen larger than 0% and not larger than 1% is used as the raw material gas having low carbon concentration, while a raw material gas (B) having a C/H ratio larger than 1% and not larger than 8% is used as the raw material gas having high carbon concentration. When a mixed gas of methane ($CH_4$) and hydrogen ($H_2$) is used, the molar ratio ($CH_4/H_2$) of methane with respect to hydrogen is 0 to 2% in raw material gas A, and 2 to 20% in raw material gas B. When supplying the raw material gas, the period (Pa) for supplying raw material gas A and the period (Pb) for supplying raw material gas B are repeated alternately. Pa is longer than Pb, and Pb is repeated intermittently in the shape of pulses between the periods Pa. If the duration of Pa is represented as "a" (minutes) and the duration of Pb is represented as "b" (minutes), the relation between a and b can be defined by the following expression, for example:

$$0.01 \leq b/(a+b) \leq 0.5$$

Without such a variation in the carbon concentration during formation of the diamond, it is difficult to provide the fluctuation in an appropriate range with respect to the orientation of the (111) crystal planes. Conditions for vapor phase deposition of diamond using material gas having a constant carbon concentration or a continuous or step-wise monotonously varying carbon concentration are described extensively in European Patent Application Nos. 0,319,926 and 0,449,571, for example. However, it is difficult to deposit diamond with the (111) planes of crystal grains oriented with a prescribed fluctuation of the orientation within an appropriate range under the conditions disclosed in these applications.

In order to form a polycrystalline diamond having a rake face in which the (111) planes are oriented with a FWHM value being in the range of 2° to 20°, a constant supply of a raw material gas with low carbon concentration is not sufficient. By intermittently supplying the raw material gas having high carbon concentration, a large number of crystal nuclei can be generated, which contribute to the appropriate fluctuation of the orientation of the crystal axes.

It is preferred that at the cutting edge, the (111) plane is oriented as the principal plane in a region extending from the rake face to a depth of at least 20 μm. When the strength of the (111) plane by X-ray analysis at the rake face is represented by 100, the strength of the (220) plane, the (311) plane, the (400) plane and the (331) plane should be about 80 or less, for example 1 to 80, and more preferably about 10 or less, for example 1 to 10. With respect to the surface roughness of the rake face, $R_{max}$ should be at most 0.5 μm. Further, the FWHM value of the rocking curve of the (220) plane should be at least 20°.

EXAMPLE 1

A mirror finished Si base material was prepared to have a surface roughness $R_{max}$ of at most 0.2 μm. By a known thermal filament CVD process employing a linear tungsten filament having a diameter of 0.5 mm and a length of 100 mm as a hot electron radiator, a polycrystalline diamond having a thickness of about 500 μm was deposited on the Si mirror surface under the following conditions.

Figure 4:
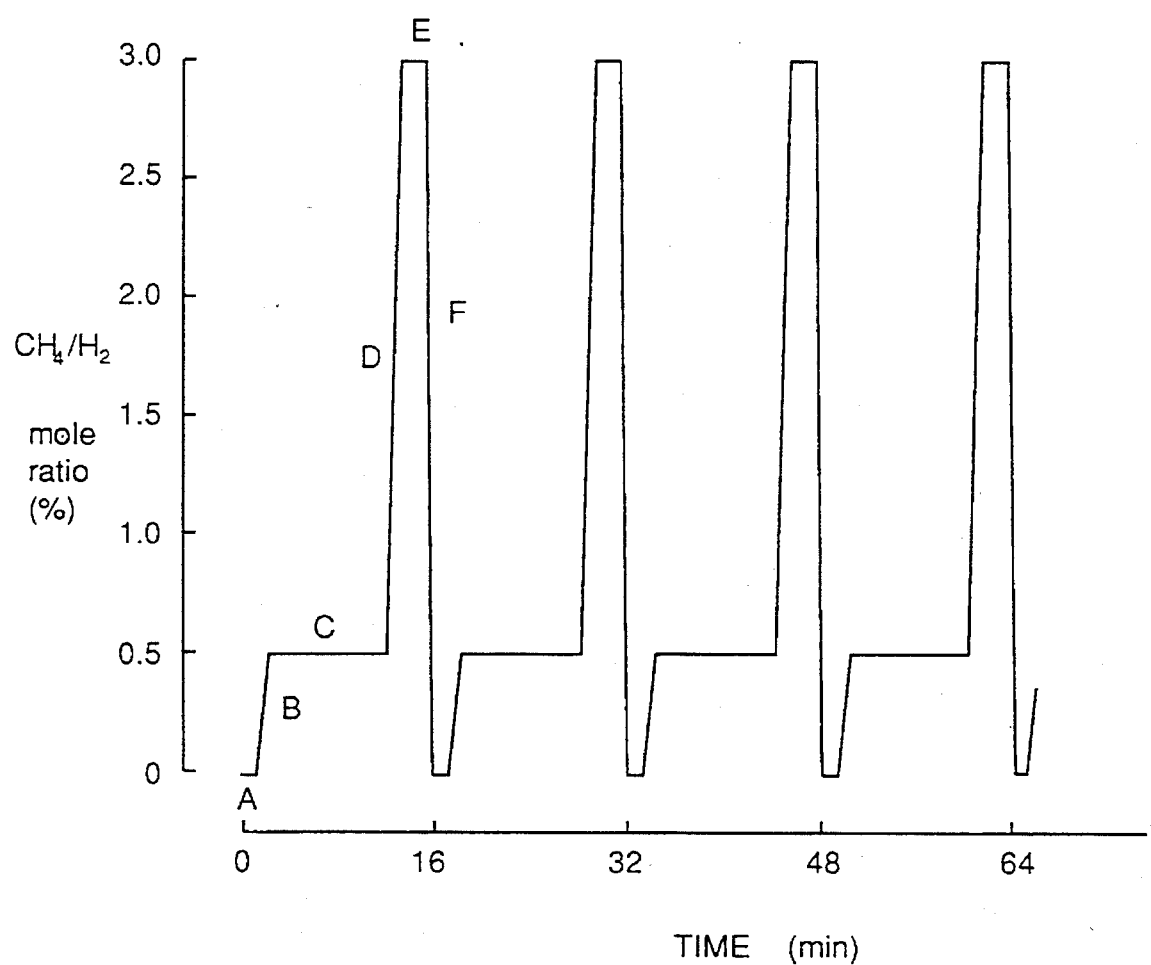
FIG. 4 is a graph showing the variation over time of the composition of a raw material gas used in a gas supply process for forming the diamond according to the invention.

A mixed gas of hydrogen and methane was used as the raw material gas for the deposition process. The total flow rate of the raw material gas was 1000 cc/min. FIG. 4 shows the gas supply process that was employed. A low methane concentration gas having a molar ratio of methane with respect to hydrogen ($CH_4/H_2$) of 0.5%, and a high methane concentration gas having a $CH_4/H_2$ ratio of 3% were automatically, alternately supplied from a raw material supplying device in accordance with a program. More specifically, a cycle including the steps A-B-C-D-E-F specified below and shown in FIG. 4 was carried out in 16 minutes, and the cycle was repeated as necessary to form the desired thickness of diamond.

A: $CH_4/H_2$ 0% ($H_2$ only), 1 minute

B: $CH_4/H_2$ 0→0.5%, 1 minute

C: $CH_4/H_2$ 0.5%, 10 minutes

D: $CH_4/H_2$ 0.5→3%, 1 minute

E: $CH_4/H_2$ 3%, 2 minutes

F: $CH_4/H_2$ 3→0%, 1 minute

Additional conditions were as follows:

Gas pressure: 80 Torr

Filament temperature: 2100° C.

Filament-to-substrate distance: 5 mm

Substrate temperature: 920° C.

Then, the polycrystalline diamond deposited on the Si base material was cut by a laser to the necessary size and shape as the cutting edge member, and the Si base material was dissolved and removed by fluoronitric acid, thus providing a polycrystalline diamond cutting edge. On the crystal growth end or termination surface of the as-obtained member, Ti was deposited to a thickness of 1 μm, and Ni was deposited successively to a thickness of 2 μm thereon. Using this face, on which the metallization layer was formed, as a joint surface, the cutting edge member was vacuum-brazed on a base metal of cemented carbide (SPG 422) using silver solder. $R_{max}$ of the rake face of the cutting edge was 0.2 μm.

The main portion of the tool obtained by brazing the cutting edge member onto the tool base or substrate is shown in FIG. 1. At a prescribed region of base metal 1 of cemented carbide, the diamond cutting edge member 2 is secured through brazing layer 3 and metallization layer 4. The rake face 5 of the cutting edge member 2 is formed with a strong orientation of the (111) plane. At an end surface of the cutting edge member 2, a flank face 7 is formed. An X-ray beam was directed at the rake face of the cutting edge member and the intensity of the index of each plane of the diamond was measured by θ–2θ scanning. The result obtained is shown in Table 1, in which the intensity of each plane is given, with the intensity of the (111) plane being assigned the reference value 100.

TABLE 1

| index of crystal plane | relative intensity; ((111) intensity = 100) | angle 2θ (°) |
| --- | --- | --- |
| (111) | 100 | 43.6 |
| (220) | 1 | 75.3 |
| (311) | 1 | 91.2 |
| (400) | 1 | 119.48 |
| (331) | 1 | 143.52 |

Then, in order to quantitatively measure the fluctuation of the orientation of the (111) plane at the rake face, rocking curves with respect to the (111) plane and the (220) plane were obtained by using a common X-ray diffractometer. The FWHM value of the rocking curve with respect to the (111) plane was about 5°. The FWHM value of the rocking curve for the (220) plane was about 60°.

EXAMPLES 2 TO 8

In Example 2, a 19 minute cycle as defined below was used and repeated to form the diamond. Thus, diamond having a thickness of about 450 μm was deposited on the Si substrate. Except for the following particular specifications of the cycle, similar conditions as Example 1 were employed.

| | $CH_4/H_2$ | time |
| --- | --- | --- |
| A: | 0%, | 1 minute |
| B: | 0 → 0.2%, | 1 minute |
| C: | 0.2%, | 10 minutes |
| D: | 0.2 → 1%, | 1 minute |
| E: | 1%, | 2 minutes |
| F: | 1 → 5%, | 1 minute |
| G: | 5%, | 2 minutes |
| H: | 5 → 0%, | 1 minute |

In Example 3, a 34 minute cycle as defined below was used and repeated to form the diamond. In the period E, $O_2$ was added with the molar ratio of $O_2$ with respect to $CH_4$ ($O_2/CH_4$) being 30%. Diamond was deposited under similar conditions as in Example 1 except for the particularly specified periods of this cycle.

| | $CH_4/H_2$ (%) | time |
| --- | --- | --- |
| A: | 0 | 1 minute |
| B: | 0 → 0.6, | 1 minute |
| C: | 0.6, | 10 minutes |
| D: | 0.6 → 3, | 1 minute |
| E: | 3, | 20 minutes |
| F: | 3 → 0, | 1 minute |

In Example 4, a 16 minute cycle as defined below was used and repeated to deposit diamond to a thickness of about 500 μm. Other conditions were similar to those of Example 1.

| | $CH_4/H_2$ (%) | time |
| --- | --- | --- |
| A: | 0 | 1 minute |
| B: | 0 → 0.2 | 1 minute |
| C: | 0.2 | 10 minutes |
| D: | 0.2 → 1.5 | 1 minute |
| E: | 1.5 | 2 minutes |
| F: | 1.5 → 0 | 1 minute |

In Example 5, the cycle of 16 minutes as defined below was repeated and diamond having a thickness of about 500 μm was vapor-deposited. Other conditions were similar to those of Example 1.

| | $CH_4/H_2$ (%) | time |
| --- | --- | --- |
| A: | 0 | 1 minute |
| B: | 0 → 0.8 | 1 minute |
| C: | 0.8 | 10 minutes |
| D: | 0.8 → 3 | 1 minute |
| E: | 3 | 2 minutes |
| F: | 3 → 0 | 1 minute |

In Comparative Example 6, diamond was deposited in a similar manner as in Example 1, except that the $CH_4/H_2$ ratio was kept constant at 0.1%.

In Comparative Example 7, diamond was deposited in a similar manner as in Example 1, except that the $CH_4/H_2$ ratio was kept constant at 2%.

In Comparative Example 8, diamond was deposited in a similar manner as in Example 1, except that the $CH_4/H_2$ ratio was kept constant at 4%.

In these Examples, the values of 0.1, 0.2, 0.5, 0.6, 0.8, 1, 1.5, 2, 3, 4 and 5 of the $CH_4/H_2$(%) ratio correspond respectively to 0.05, 0.10, 0.25, 0.3, 0.39, 0.49, 0.73, 0.96, 1.4, 1.9 and 2.3 of the ratio C/H (atm. %).

By using the as-obtained diamonds, cutting tools were fabricated in a similar manner as in Example 1. The relative intensities of the crystal planes with respect to the rake face and the FWHM values of the rocking curves with respect to the (111) plane and the (220) plane are listed in Table 2 below. The samples obtained in Examples 1 to 8 were attached to milling cutters, and milling was performed on an engine block cylinder head of Al alloy containing 12% of Si. The conditions for milling were as follows:

Cutting speed: V=1190 m/min

Depth of cut: d=0.5 mm

Feed speed: f=0.12 mm/blade

Environment: wet

The results of milling are also listed in Table 2.

TABLE 2

| | No. | relative intensity (max, intensity = 100) | | | | | FWHM of rocking curve | | number of milling times |
| --- | --- | --- | --- | --- | --- | --- | --- | --- | --- |
| | | (111) | (220) | (311) | (400) | (331) | (111) | (220) | (times) |
| A | 1 | 100 | 1 | 1 | 1 | 1 | 5 | 60 | 18000 |
| | 2 | 100 | 7 | 2 | 1 | 4 | 15 | 55 | 11800 |

TABLE 2-continued

| No. | | relative intensity (max, intensity = 100) | | | | | FWHM of rocking curve | | number of milling times |
|---|---|---|---|---|---|---|---|---|---|
| | | (111) | (220) | (311) | (400) | (331) | (111) | (220) | (times) |
| | 3 | 100 | 5 | 2 | 1 | 3 | 8.4 | 45 | 12900 |
| | 4 | 100 | 1 | 0 | 0 | 1 | 3 | 75 | 15500 |
| | 5 | 100 | 8 | 3 | 2 | 5 | 18 | 58 | 9800 |
| B | 6 | 100 | 0 | 0 | 0 | 0 | 0.3 | ∞ | damaged at first milling |
| | 7 | 14 | 100 | 3 | 2 | 13 | 24 | 18 | wear width over 250 μm at 80 times of milling |
| | 8 | 1 | 100 | 1 | 0 | 2 | 43 | 8 | wear width over 300 μm at 15 times milling |

Figure 5:
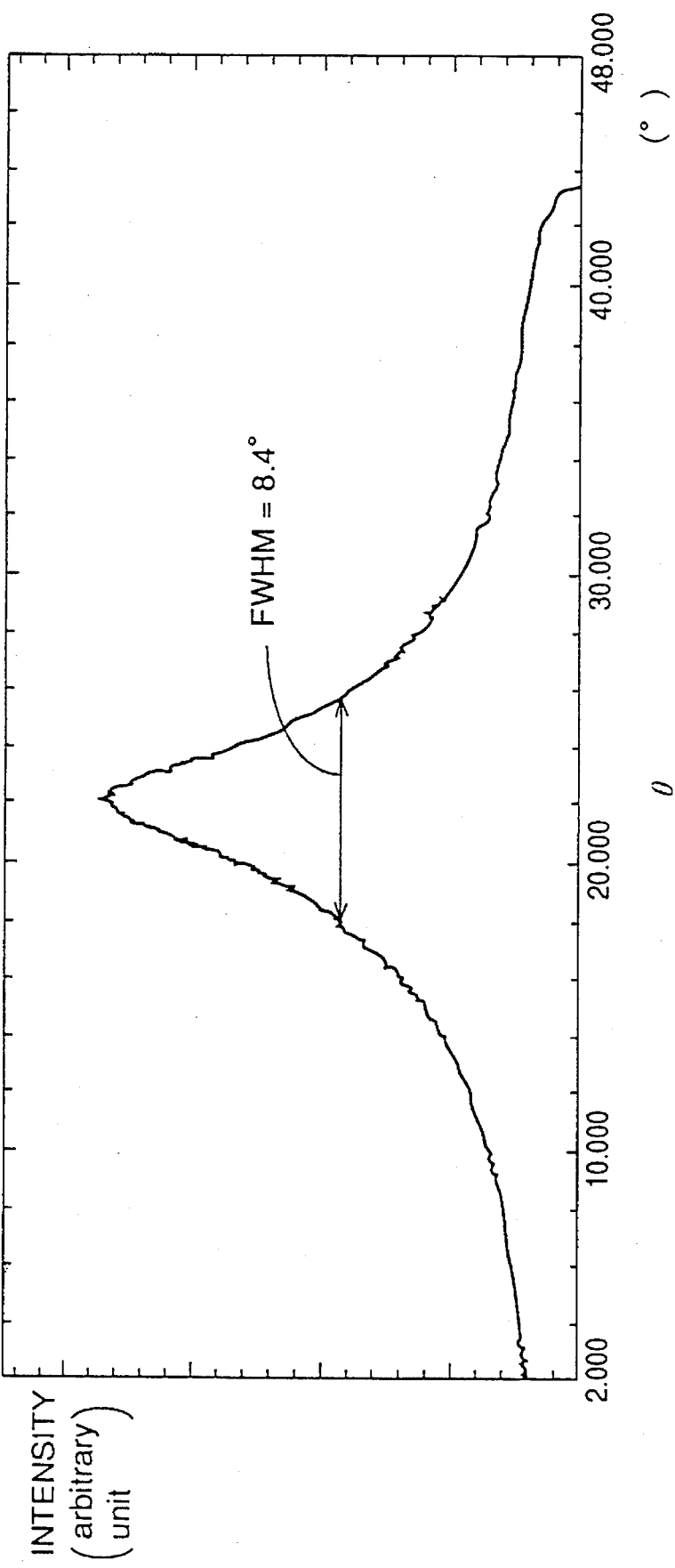
FIG. 5 is a graph showing the rocking curve with respect to the (111) plane of a diamond material prepared in Example 3 according to the invention.
Figure 6:
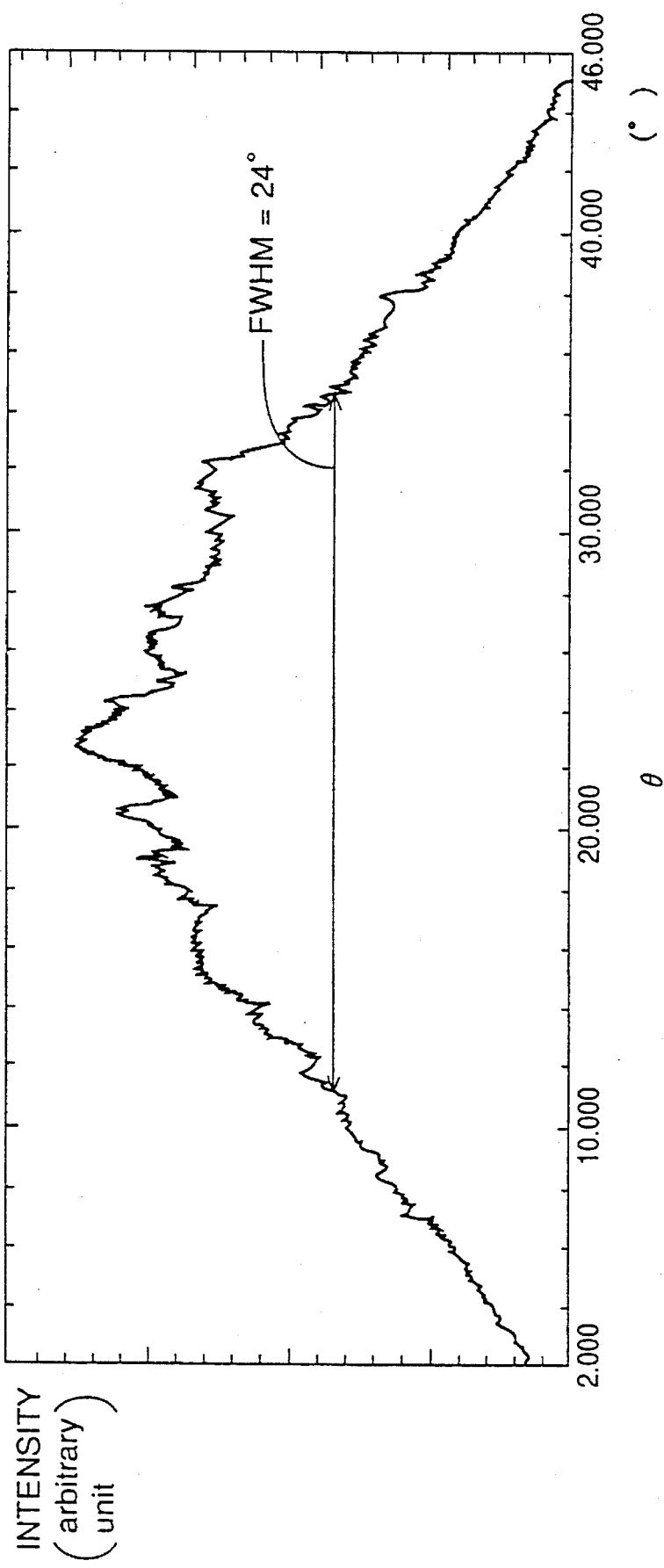
FIG. 6 is a graph showing the rocking curve with respect to the (111) plane of a diamond material prepared in Comparative Example 7.

The rocking curves with respect to the (111) plane of Examples 3 and 7 are shown in FIGS. 5 and 6 respectively.

EXAMPLE 9

A mirror finished Si base material having $R_{max}$ of at most 0.2 μm was prepared, and polycrystalline diamond having a thickness of 250 μm was formed on the mirror surface of Si under the same conditions of synthesizing as in Example 1.

Thereafter, thermal filament CVD was performed under the following conditions, so that diamond was further deposited on the as-formed polycrystalline diamond. Material gas (flow rate): $C_2H_2/H_2$=3%, total flow rate 1000 cc/min Gas pressure: 80 Torr Filament temperature: 2150° C.

Filament-to-substrate distance: 7 mm

Substrate temperature: 960° C.

Figure 2A:
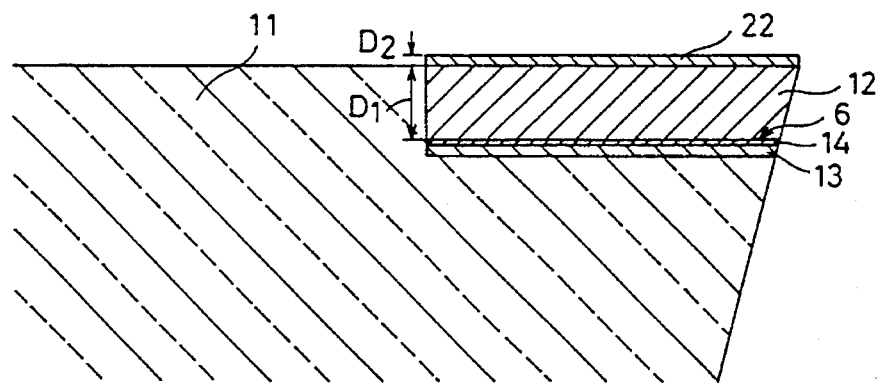
FIGS. 2A and 2B are sectional views schematically illustrating steps of manufacturing a diamond cutting tool prepared in Example 9.
Figure 2B:
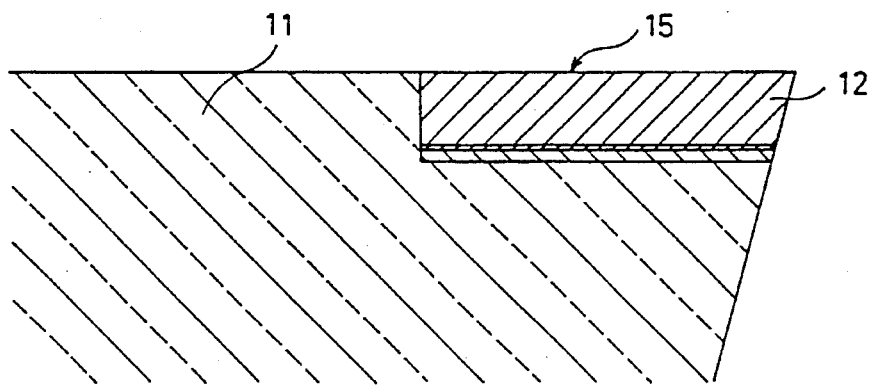

Regarding the second or later-formed diamond layer, it was determined that the intensity ratio of the (111) plane with respect to the (220) plane, i.e., I(111)/I(220) was 0.08 with strong orientation of the (220) plane parallel to the base material surface. Further, the thickness of the second diamond layer was 20 μm. The diamond material on the Si base material was cut with a laser beam into dimensions and shapes required for a tool, and thereafter the Si base material was dissolved and removed by fluoronitric acid to obtain a cutting edge member of diamond. In the as-obtained diamond cutting edge member, Ti and Ni were successively stacked or applied on a surface which had been in contact with the base material, in thicknesses of about 1 μm and 2 μm respectively. Thereafter, this cutting edge member was vacuum-brazed to a base of cemented carbide (SPG422) with silver solder so that the surface provided with this metallization layer defined a joint surface. FIG. 2A shows a principal part of a tool in a state immediately after such brazing. A cutting edge 12 of diamond was fixed to a prescribed region of a base 11 of cemented carbide through a brazing layer 13 and a metallization layer 14. In this cutting edge member 12, the (111) crystal plane was dominantly oriented substantially parallel with a joint surface in a first region or layer $D_1$ having a thickness of 250 μm from the joint surface 6, while the (220) plane was dominantly oriented substantially parallel with the joint surface in a second region or layer $D_2$ having a thickness of 20 μm, deposited thereon. Then, the diamond layer 22 corresponding to the second region $D_2$ was removed by lapping. Through this mirror polishing, it was possible to expose the (111) plane of the previously formed, first diamond layer and to obtain a mirror face having surface roughness $R_{max}$ of 0.1 μm. FIG. 2B shows a principal part of the as-obtained diamond cutting tool. The rake face 15 of the cutting edge member is flat and polished and mostly formed of the (111) plane.

EXAMPLE 10

Polycrystalline diamond having a thickness of 20 μm was formed on an Si mirror surface by thermal filament CVD using an apparatus similar to that employed in Example 1 under the following conditions: Raw material gas (flow rate): $CH_4/H_2$=3%, total flow rate 1000 cc/min Gas pressure: 80 Torr Filament temperature: 2150° C.

Filament-to-substrate distance: 6 mm

Substrate temperature: 920° C.

Then, polycrystalline diamond deposited on the Si base material was cut with a laser beam into dimensions and shapes required for a tool, and thereafter the Si base material was dissolved and removed by fluronitric acid to obtain a cutting edge member of diamond. The as-obtained diamond cutting edge member was subjected to X-ray analysis, whereby it was recognized that the peak intensity ratio I(111)/I(220) was 0.1 with strong orientation of the (220) plane. This (220) plane exhibited an FWHM value of about 10° in a rocking curve. The chip or cutting edge insert member obtained in this manner was brazed to a base metal of cemented carbide in a similar manner as in Example 1.

In order to evaluate the performance of the diamond cutting tools prepared in Examples 9 and 10, a cutting test or machining test was made under the following cutting conditions:

Workpiece: A390 alloy (Al–17% Si)

Cutting speed: 800 m/min

Feed speed: 0.12 mm/rev

Depth of cut: 0.5 mm

As a result of continuously carrying out the cutting test for about 30 minutes, samples prepared according to the examples of the present invention exhibited excellent characteristics, with the maximum flank wear width ($V_{Bmax}$: μm) of Example 9 being 40 μm. Meanwhile, in Example 10, large chipping of 100 μm or more was observed after 1 minute of the continuous cutting test.

Although the invention has been described with reference to specific example embodiments, it will be appreciated that it is intended to cover all modifications and equivalents within the scope of the appended claims.

What is claimed is:

1. A diamond cutting tool, comprising a tool substrate, a cutting edge member consisting essentially of a vapor-deposited polycrystalline diamond material including a plurality of crystal grains, and an intermediate layer forming a brazed bond between said cutting edge member and said tool substrate, wherein said intermediate layer consists essentially of at least one material selected from the group consisting of metals included in groups IVa, IVb, Va, Vb, VIa, VIb, VIIa and VIIb of the periodic table and compounds thereof, wherein a principal diamond crystal plane forming a rake face of said cutting edge member is defined by respective (111) planes of said crystal grains, and wherein said respective (111) planes are non-uniformly oriented and have a fluctuation in orientation represented by an FWHM value of a rocking curve with respect to said (111) planes as determined by X-ray diffractometry of said rake face being in a range from about 2° to about 20°.

2. The diamond cutting tool in accordance with claim 1, wherein said (111) planes are oriented substantially in parallel with said rake face, within the extent of said fluctuation in orientation, in a region from said rake face to a depth of at least about 20 μm from said rake face in said cutting edge member.

3. The diamond cutting tool in accordance with claim 1, wherein (220), (311), (400) and (331) crystal planes of said diamond material have an X-ray analysis intensity that is not more than about 80 percent of an X-ray analysis intensity of said (111) planes.

4. The diamond cutting tool in accordance with claim 3, wherein said X-ray analysis intensity of said (220), (311), (400) and (331) planes is not more than about 10 percent of said X-ray analysis intensity of said (111) planes.

5. The diamond cutting tool in accordance with claim 1, wherein an FWHM value of a rocking curve with respect to a (220) crystal plane of said diamond material as determined by X-ray diffractometry of said rake face is at least about 20°.

6. The diamond cutting tool in accordance with claim 1, wherein said rake face has a surface roughness $R_{max}$ of not more than about 0.5 μm.

7. The diamond cutting tool in accordance with claim 1, wherein said tool substrate consists essentially of cemented carbide.

8. The diamond cutting tool in accordance with claim 1, wherein said cutting edge member comprises a crystal growth nucleation surface and a crystal growth termination surface, and wherein said cutting edge member is bonded to said substrate by said intermediate layer in a configuration with said crystal growth nucleation surface forming said rake face and with said crystal growth termination surface forming a bond surface facing said intermediate layer between said member and said substrate.

9. The diamond cutting tool in accordance with claim 1, wherein said vapor-deposited polycrystalline diamond material was deposited by a vapor phase deposition process while cyclically varying a composition of a material gas for said vapor phase deposition process through a plurality of cycles.

* * * * *

UNITED STATES PATENT AND TRADEMARK OFFICE
CERTIFICATE OF CORRECTION

PATENT NO. : 5,567,522
DATED : Oct. 22, 1996
INVENTOR(S) : Tanabe et al.

It is certified that error appears in the above-indentified patent and that said Letters Patent is hereby corrected as shown below:

Cols. 11 & 12, approx. line 15, after Table 2-continued insert:

--A: Examples of the Invention    B:   Examples for Comparison--.

Signed and Sealed this

Twenty-fourth Day of December, 1996

Attest:

BRUCE LEHMAN

Attesting Officer    Commissioner of Patents and Trademarks